US010026673B2

(12) United States Patent
Okumura

(10) Patent No.: US 10,026,673 B2
(45) Date of Patent: Jul. 17, 2018

(54) SEMICONDUCTOR DEVICE AND POWER MODULE

(71) Applicant: DENSO CORPORATION, Kariya, Aichi-pref. (JP)

(72) Inventor: Tomomi Okumura, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/522,972

(22) PCT Filed: Nov. 20, 2015

(86) PCT No.: PCT/JP2015/005799
§ 371 (c)(1),
(2) Date: Apr. 28, 2017

(87) PCT Pub. No.: WO2016/079995
PCT Pub. Date: May 26, 2016

(65) Prior Publication Data
US 2017/0317006 A1     Nov. 2, 2017

(30) Foreign Application Priority Data
Nov. 21, 2014   (JP) .................................. 2014-236861

(51) Int. Cl.
*H01L 23/00* (2006.01)
*H01L 25/07* (2006.01)
(Continued)

(52) U.S. Cl.
CPC ...... *H01L 23/3675* (2013.01); *H01L 23/3114* (2013.01); *H01L 23/50* (2013.01);
(Continued)

(58) Field of Classification Search
CPC . H01L 23/3675; H01L 23/3114; H01L 23/50; H01L 24/32; H01L 24/48;
(Continued)

(56) References Cited

U.S. PATENT DOCUMENTS 7,944,045 B2 *   5/2011   Noritake ............... H01L 23/051
                                                        257/675
2002/0149099 A1   10/2002   Shirasaka et al.
(Continued)

FOREIGN PATENT DOCUMENTS

| JP | H10-116959 A | 5/1998 |
|----|--------------|--------|
| JP | 2006-27315 A | 2/2006 |

(Continued)

*Primary Examiner* — Nikolay Yushin
(74) *Attorney, Agent, or Firm* — Posz Law Group, PLC

(57) ABSTRACT

A semiconductor device of a double-side cooling structure having a bus bar electrically connected, and coolers independently arranged on both sides of the semiconductor device for cooling is provided. The semiconductor device includes: a semiconductor chip including an element, and has a first main surface and a second main surface; a sealing resin body having a first surface and a second surface and also having a side surface; a first heatsink arranged facing the first main surface and electrically connected to the first main electrode; and a second heatsink arranged facing the second main surface and electrically connected to the second main electrode. The first heatsink is exposed only to the first surface. The second heatsink is exposed only to the second surface. An exposed surface of a heatsink to be electrically connected to the bus bar has a heat dissipation region, and an electrical connection region.

10 Claims, 9 Drawing Sheets

(51) Int. Cl.
  *H01L 23/367* (2006.01)
  *H01L 23/50* (2006.01)
  *H01L 23/31* (2006.01)
  *H01L 25/18* (2006.01)
  *H02P 27/06* (2006.01)

(52) U.S. Cl.
  CPC ............ *H01L 24/32* (2013.01); *H01L 24/48* (2013.01); *H01L 24/73* (2013.01); *H01L 25/072* (2013.01); *H01L 25/18* (2013.01); *H02P 27/06* (2013.01); *H01L 2224/32245* (2013.01); *H01L 2224/48175* (2013.01); *H01L 2224/73265* (2013.01); *H01L 2924/10253* (2013.01); *H01L 2924/1203* (2013.01); *H01L 2924/13055* (2013.01); *H01L 2924/14252* (2013.01)

(58) Field of Classification Search
  CPC ....... H01L 24/73; H01L 25/072; H01L 25/18; H01L 25/0652; H01L 2224/32245; H01L 2224/48175; H01L 2224/73265; H01L 2924/10253; H01L 2924/1203; H01L 2924/13055; H01L 2924/14252; H02P 27/06
  See application file for complete search history.

(56) References Cited

U.S. PATENT DOCUMENTS

2007/0001275 A1 1/2007 Shirasaka et al.
2013/0265724 A1 10/2013 Kaneko et al.

FOREIGN PATENT DOCUMENTS

| JP | 2010-87111 A | 4/2010 |
| JP | 2013-149684 A | 8/2013 |
| JP | 2014-157927 A | 8/2014 |

\* cited by examiner

# SEMICONDUCTOR DEVICE AND POWER MODULE

CROSS REFERENCE TO RELATED APPLICATIONS

This application is a U.S. national stage of International Patent Application No. PCT/JP2015/005799 filed on Nov. 20, 2015 and is based on Japanese Patent Application No. 2014-236861 filed on Nov. 21, 2014, the disclosure of which is incorporated herein by reference.

TECHNICAL FIELD

The present disclosure relates to a semiconductor device of a double-side cooling structure having a bus bar electrically connected thereto as an electrical relay member and coolers independently arranged on both sides thereof for cooling. The present disclosure also relates to a power module including the semiconductor device.

BACKGROUND ART

As described in Patent Literature 1, there has been known a semiconductor device of a double-side cooling structure having a bus bar electrically connected thereto as an electrical relay member and coolers independently arranged on both sides thereof for cooling.

The semiconductor device of the double-side cooling structure includes a semiconductor chip having an element such as an insulated gate bipolar transistor (IGBT) formed thereon, a sealing resin body with which the semiconductor chip is sealed, and a first heatsink and a second heatsink for dissipating heat from the semiconductor chip. The semiconductor chip has a first main surface on which a first main electrode of the element is arranged and a second main surface on which a second main electrode of the element is arranged, the second main surface being opposite to the first main surface. The sealing resin body has a front surface facing the first main surface of the semiconductor chip in a thickness direction of the semiconductor chip, a rear surface facing the second main surface of the semiconductor chip in the thickness direction, and side surfaces connecting between the front surface and the rear surface. The first heatsink is arranged on a side of the first main surface of the semiconductor chip and is electrically connected to the first main electrode. The second heatsink is arranged on a side of the second main surface of the semiconductor chip and is electrically connected to the second main electrode.

The first heatsink has an exposed surface exposed from the front surface of the sealing resin body, the exposed surface being opposite to a surface facing the semiconductor chip. The second heatsink has an exposed surface exposed from the rear surface of the sealing resin body, the exposed surface being opposite to a surface facing the semiconductor chip.

PRIOR ART LITERATURE

Patent Literature

Patent Literature 1: JP 2013-149684 A

SUMMARY OF INVENTION

In the conventional semiconductor device, the coolers are mounted to the exposed surfaces of the respective heatsinks to dissipate heat from the semiconductor chip. Meanwhile, each heatsink is electrically connected with corresponding external connection terminals (e.g., N-terminal, P-terminal O-terminal). The multiple terminals are drawn from the side surfaces of the sealing resin body to the outside, and are electrically connected to the corresponding bus bar. For example, one of the terminals is connected to a positive electrode of a direct-current (DC) power source via the bus bar and a smoothing capacitor.

As thus described, the terminal electrically connected with the first main electrode and the terminal electrically connected with the second main electrode are drawn from the side surfaces of the sealing resin body to the outside. The sealing resin body is formed by, for example, transfer molding. Therefore, when the terminal is thick, protrusion of resin may occur in molding of the sealing resin body. Consequently, the thickness of the terminal is required to be reduced, which may cause an increase in inductance. That is, a surge voltage at the time of switching becomes problematic.

It is an object of the present disclosure to provide a semiconductor device of a double-side cooling structure, the semiconductor device being capable of reducing an increase in inductance caused by an external connection terminal, and to provide a power module.

According to one aspect of the present disclosure, a semiconductor device is a semiconductor device of a double-side cooling structure having a bus bar electrically connected as an electrical relay member, and coolers independently arranged on both sides of the semiconductor device for cooling. The semiconductor device includes: a semiconductor chip that includes an element, and has a first main surface on which a first main electrode of the element is arranged and a second main surface on which a second main electrode of the element is arranged, the second main surface being opposite to the first main surface; a sealing resin body that has a first surface facing the first main surface of the semiconductor chip and a second surface facing the second main surface of the semiconductor chip in a thickness direction of the semiconductor chip and also has a side surface connecting between the first surface and the second surface, the sealing resin body being configured to seal the semiconductor chip; a first heatsink that is arranged facing the first main surface of the semiconductor chip and electrically connected to the first main electrode; and a second heatsink arranged facing the second main surface of the semiconductor chip and electrically connected to the second main electrode. The first heatsink is exposed only to the first surface of the sealing resin body, of the first surface, the second surface, and the side surface of the sealing resin body, to have an exposed surface opposite to a surface facing the semiconductor chip. The second heatsink is exposed only to the second surface of the sealing resin body, of the first surface, the second surface, and the side surface of the sealing resin body, to have an exposed surface opposite to a surface facing the semiconductor chip, the exposed surface being exposed from the second surface. The exposed surface of a heatsink to be electrically connected to the bus bar, of the first heatsink and the second heatsink, has, as seen in projection view from the thickness direction, a heat dissipation region to be thermally connected with the coolers, the heat dissipation region being a region overlapping with the semiconductor chip, and an electrical connection region to be electrically connected with the bus bar, the electrical connection region being a peripheral region of the heat dissipation region.

With this configuration, the coolers are independently thermally connected to the heat dissipation regions on the exposed surfaces of the respective heatsinks. It is thus possible to dissipate the heat of the semiconductor chip to both the sides.

Further, the bus bar is electrically connected to the electrical connection region on the exposed surface of each heatsink. As thus described, the bus bar is connected to each heatsink without an external connection terminal (outer lead). Since no external connection terminal is provided, it is possible to reduce an increase in inductance caused by a thin terminal.

According to another aspect of the present disclosure, a power module includes: the semiconductor device; coolers independently arranged on the heat dissipation regions of the exposed surfaces of the respective heatsinks and configured to cool the semiconductor device; a first bus bar connected to the electrical connection region of the exposed surface of the first heatsink; and a second bus bar connected to the electrical connection region of the exposed surface of the second heatsink. The first bus bar and the second bus bar extend more outward than the semiconductor device in a single direction orthogonal to the thickness direction, and are in a positional relation of overlapping each other as seen in projection view from the thickness direction.

According to still another aspect of the present disclosure, a power module includes: the semiconductor device; coolers independently arranged on the heat dissipation regions of the exposed surfaces of the respective heatsinks and configured to cool the semiconductor device; a first bus bar connected to the electrical connection region of the exposed surface of the first heatsink; a second bus bar connected to the electrical connection region of the exposed surface of the second heatsink; and insulating plates independently interposed between the heat dissipation regions of the exposed surfaces of the respective heatsinks and the coolers, and configured to transmit heat of the semiconductor device to the coolers and to electrically separate the semiconductor device and the coolers from each other. The insulating plates have extended parts extending more outward than clearances between the heat dissipation regions and the coolers to separate the heat dissipation regions and the electrical connection regions from each other.

With this configuration, a creeping distance between the cooler and the bus bar can be gained by the extended part of the insulating plate. Further, the contact between the cooler and the bus bar can be inhibited.

With the semiconductor device and the power module according to the present disclosure, it is possible to reduce an increase in inductance caused by an external connection terminal.

BRIEF DESCRIPTION OF DRAWINGS

The above and other aspects, features and advantages of the present disclosure will become more apparent from the following detailed description made with reference to the accompanying drawings. In the drawings.

DESCRIPTION OF EMBODIMENTS

Hereinafter, embodiments of the present disclosure are described with reference to the drawings. In the embodiments shown below, common or relevant components are denoted with the same reference sign. Further, a thickness direction of a semiconductor chip is defined as a Z-direction, a direction orthogonal to the Z-direction is defined as an X-direction, and a direction orthogonal to both the X-direction and the Y-direction is defined as a Y-direction. The X-Y plane defined by the X-direction and the Y-direction described above is a plane orthogonal to the Z-direction, and a shape along the X-Y plane is assumed to be a planar shape unless otherwise specified.

First Embodiment

Figure 1:
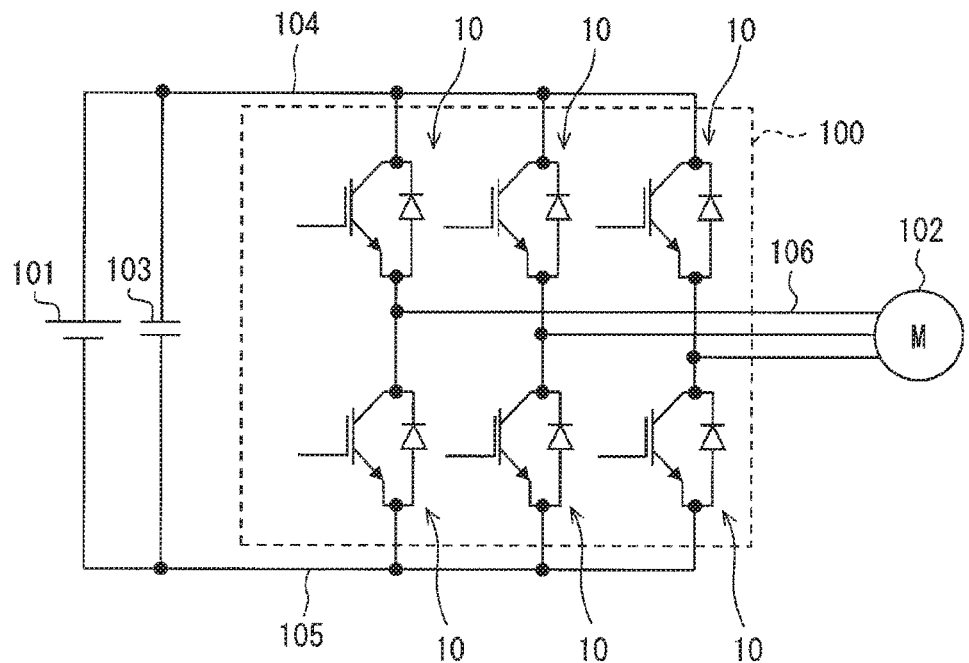
FIG. 1 is a diagram showing a schematic configuration of a power converter to which a semiconductor device is applied.

One example of a power converter, to which a semiconductor device (power module) of the present embodiment is applied, is described based on FIG. 1.

A power converter 100 shown in FIG. 113 configured to convert a DC voltage supplied from a DC power source 101 to a three-phase alternating current (AC) and to output the converted AC to a three-phase AC motor 102. Such a power converter 100 is mounted in an electric car or a hybrid car, for example. Note that the power converter 100 can also convert power generated by the motor 102 to a DC and charge the DC power source 101 (battery) with the converted DC. Reference sign 103 in FIG. 1 denotes a smoothing capacitor.

The power converter 100 has a three-phase inverter. The three-phase inverter has upper and lower arms for the three phases which are provided between a high-potential power line 104 connected to a positive electrode (high-potential side) of the DC power source 101 and a low-potential power line 105 connected to a negative electrode (low-potential side) of the DC power source 101. In the present embodiment, six arms are respectively configured with semiconductor devices 10.

Each of the semiconductor devices 10 includes an IGBT element, and a reflux free wheel diode (FWD) element connected in reverse parallel with the IGBT element. In the present embodiment, an n-channel IGBT element is employed. A cathode electrode and a collector electrode of the FWD element are used as a shared electrode, and an anode electrode and an emitter electrode thereof are used as a shared electrode.

In the semiconductor device 10, a collector electrode of the upper-arm side IGBT element is electrically connected to the high-potential power line 104, and an emitter electrode thereof is connected to a corresponding three-phase line 106 of the motor 102. Meanwhile, a collector electrode of the lower-arm side IGBT element is connected to a corresponding three-phase line 106 of the motor 102, and an emitter electrode thereof is electrically connected to the low-potential power line 105.

In addition to the foregoing three-phase inverter, the power converter 100 may include a boost converter for boosting a DC voltage supplied from the DC power source 101, and a control part for controlling operation of the switching element that constitutes the three-phase inverter and the boosting converter.

Figure 2:
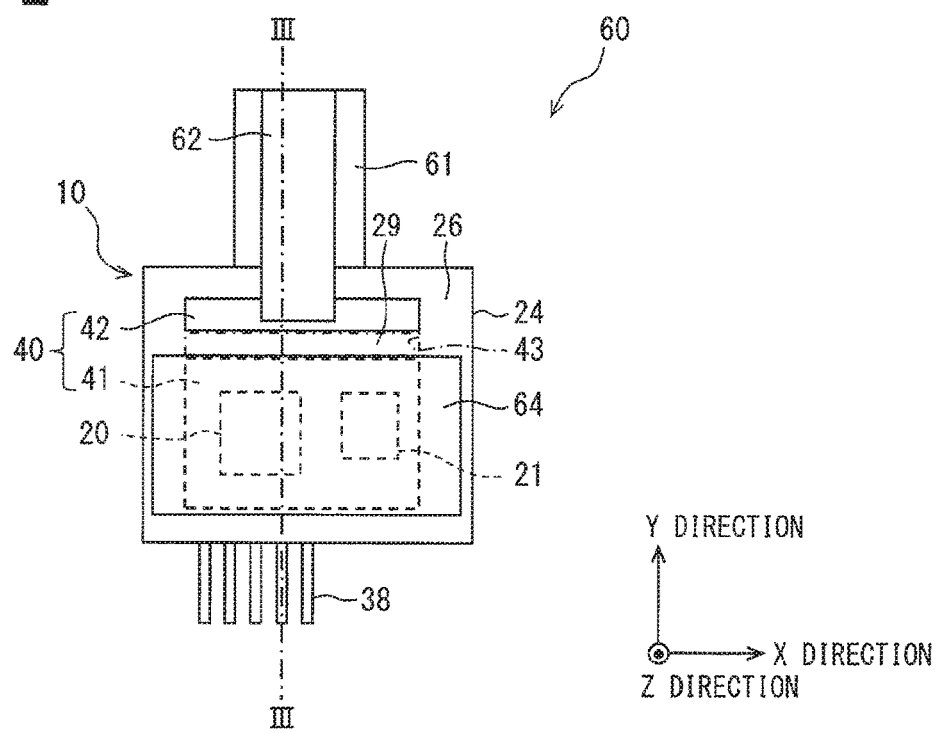
FIG. 2 is a plan view showing a schematic configuration of a power module including a semiconductor device according to a first embodiment.
Figure 3:
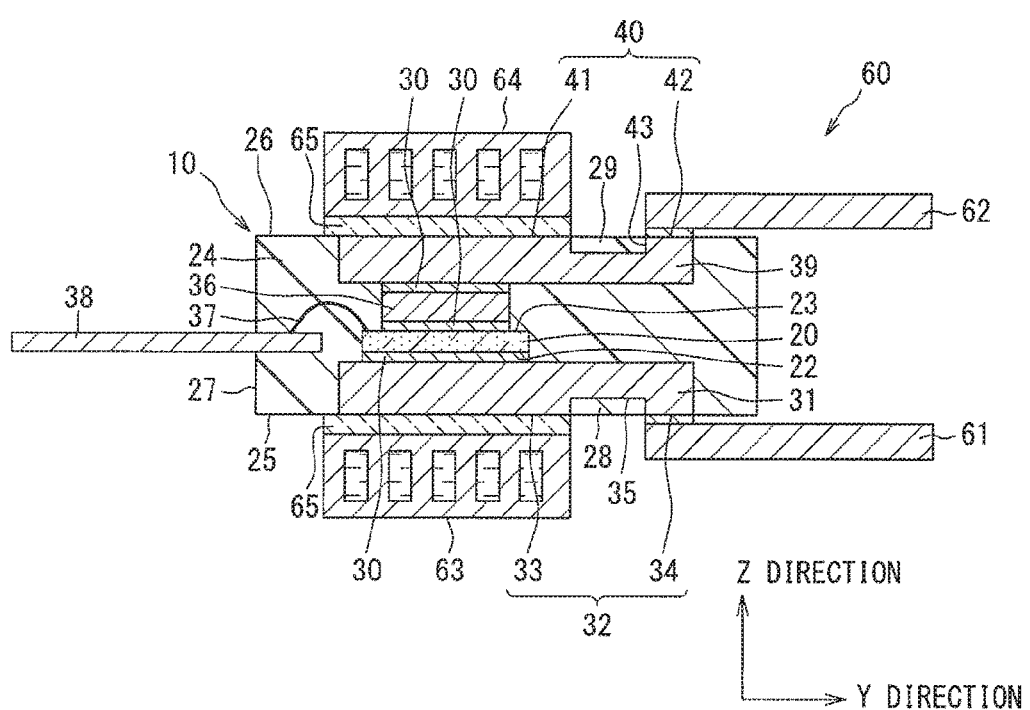
FIG. 3 is a sectional view taken along line in FIG. 2.
Figure 4:
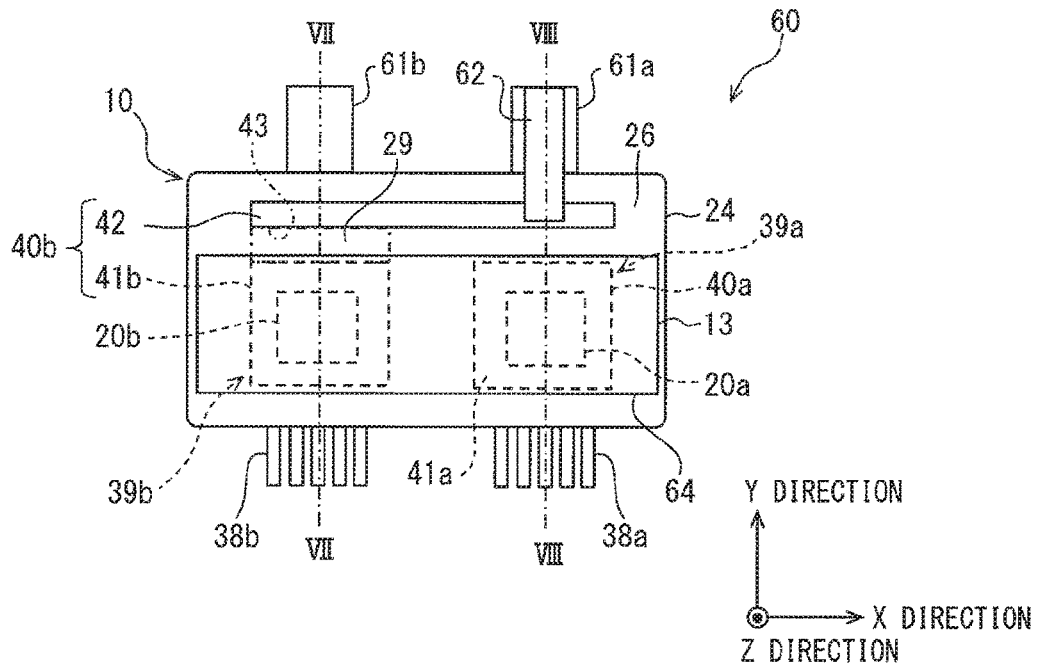
FIG. 4 is a plan view showing a schematic configuration of a power module according to a second embodiment.
Figure 5:
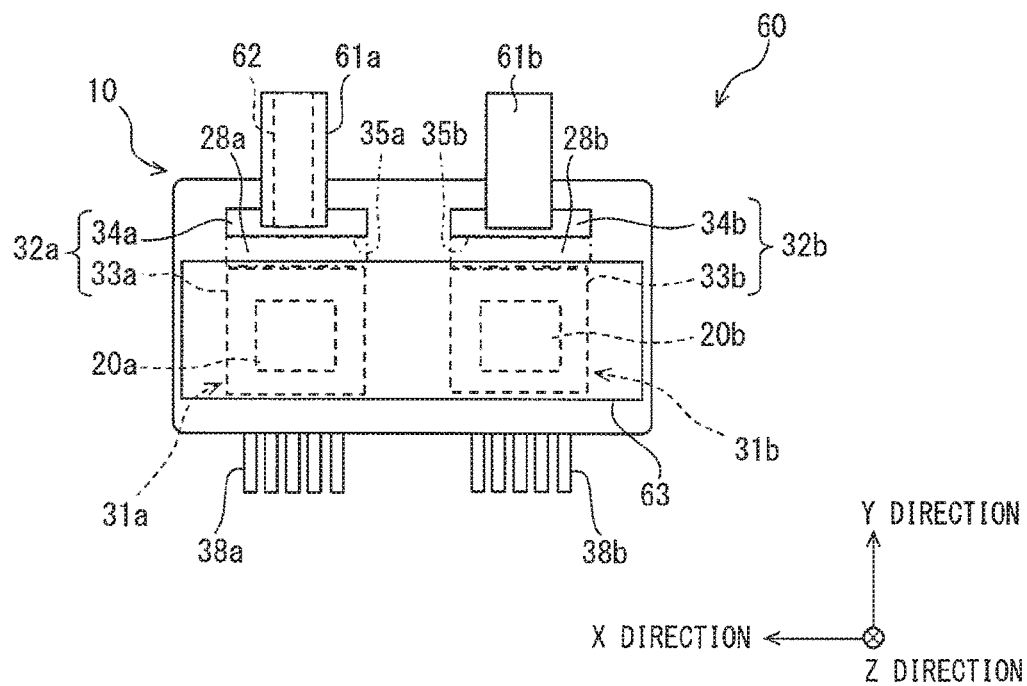
FIG. 5 is a plan view of the power module in FIG. 4, the power module being seen from the rear surface side.

Next, a configuration of the semiconductor device 10 and a configuration of a power module 60 including the semiconductor device 10 are described based on FIGS. 2 and 3.

First, the semiconductor device 10 is described. This semiconductor device 10 is known as a so-called 1-in-1 package. As shown in FIG. 2, the semiconductor device 10 includes two semiconductor chips 20, 21. The semiconductor chip 20 is obtained by forming an IGBT element as an element on a semiconductor substrate such as silicon. The semiconductor chip 21 is obtained by forming an FWD element as an element on a semiconductor substrate. In the present embodiment, the semiconductor chips 20, 21 correspond to a semiconductor chip of the present disclosure. Note that the IGBT element and the FWD element may be formed on the same semiconductor chip.

These semiconductor chips 20, 21 are arranged side by side in the X-direction, and are arranged at almost the same positions in the Z-direction. Further, planar shapes of the semiconductor chips 20, 21 are both made substantially rectangular.

As the planes orthogonal to the Z-direction, each of the semiconductor chips 20, 21 has a first main surface 22 and a second main surface 23 opposite to the first main surface 22. The IGBT element and the FWD element are both formed in a so-called vertical structure such that a current flows in the Z-direction. The semiconductor chip 20 has a collector electrode as a first main electrode on a side of the first main surface 22, and an emitter electrode as a second main electrode on a side of the second main surface 23. On the second main surface 23, a pad for a gate electrode is formed in addition to the emitter electrode. Meanwhile, the semiconductor chip 21 has a cathode electrode as a first main electrode on the first main surface 22, and an anode electrode as a second main electrode on the second main surface 23.

These semiconductor chips 20, 21 are sealed with a sealing resin body 24. The sealing resin body 24 is made of epoxy resin, for example. The sealing resin body 24 is formed in a substantially rectangular shape as seen in plan view, and has a front surface 25 orthogonal to the Z-direction, a rear surface 26 opposite to the front surface 25, and a side surface 27 connecting the front surface 25 and the rear surface 26. The front surface 25 and the rear surface 26 are flat surfaces. The front surface 25 corresponds to a first surface, and the rear surface 26 corresponds to a second surface.

Further, the sealing resin body 24 has insulating separators 28, 29. The details of the insulating separators 28, 29 are described later.

In the semiconductor chip 20, the collector electrode is formed almost over the first main surface 22. The collector electrode is electrically, thermally, and mechanically connected with a first heatsink 31 via solder 30. Likewise, the cathode electrode is also connected electrically, thermally, and mechanically with the first heatsink 31 via solder (not shown).

The first heatsink 31 performs a function of dissipating heat generated by the semiconductor chips 20, 21 to the outside of the semiconductor device 10, and a function of electrically relaying between the semiconductor chips 20, 21 and a first bus bar 61 to be described later. The first heatsink 31 is formed using at least a metal material so as to ensure thermal conductivity and electrical conductivity. For example, the first heatsink 31 is formed of a metal material excellent in thermal conductivity and electrical conductivity, such as copper, a copper alloy, or an aluminum alloy. Of surfaces of the first heatsink 31, a side surface and a region, which is a surface opposing the semiconductor chips 20, 21 and is not arranged with the solder 30, are covered with the sealing resin body 24. On the other hand, a surface of the first heatsink 31 opposite to the opposing surface is an exposed surface 32 exposed from the front surface 25 of the sealing resin body 24. The exposed surface 32 is almost flush with the front surface 25 of the sealing resin body 24.

The exposed surface 32 of the first heatsink 31 has a heat dissipation region 33 and an electrical connection region 34. In the present embodiment, a groove 35 is formed in the first heatsink 31, and the exposed surface 32 is divided into two sections in the Y-direction by the groove 35. The groove 35 is formed from one end toward the other end of the first heatsink 31 along the X-direction. The exposed surface 32 is divided by this groove 35 into the heat dissipation region 33 and the electrical connection region 34. The heat dissipation region 33 and the electrical connection region 34 are both formed in a planar rectangular shape.

The heat dissipation region 33 includes a region overlapping the semiconductor chips 20, 21 as seen in projection view from the Z-direction. In other words, the heat dissipation region 33 is defined to overlap the semiconductor chips 20, 21 in a coordinate system (X-Y coordinate system) orthogonal to the Z-direction. A first cooler 63 (to be described later) is thermally connected to the heat dissipation region 33. Hence the heat dissipation region 33 of the exposed surface 32 contributes to the heat dissipation from the semiconductor chips 20, 21.

Meanwhile, the electrical connection region 34 is a portion of the exposed surface 32 other than the heat dissipation region 33. The electrical connection region 34 is a region not overlapping the semiconductor chips 20, 21 as seen in projection view from the Z-direction. In other words, the electrical connection region 34 is defined not to overlap the semiconductor chips 20, 21 in the coordinate system orthogonal to the Z-direction. The first bus bar 61 is electrically connected to the electrical connection region 34 by welding or the like. In this manner, the electrical connection region 34 of the exposed surface 32 contributes to the electrical connection (relay) between the semiconductor chips 20, 21 and the first bus bar 61. In the Y-direction, the electrical connection region 34 is located more distant than the heat dissipation region 33 from a surface, from which a signal terminal 38 (to be described later) projects, of the side surface 27 of the sealing resin body 24.

Note that the larger heat dissipation region 33 is more preferable in terms of the heat dissipation from the semiconductor chips 20, 21. Meanwhile, the electrical connection region 34 may ensure the connection with the first bus bar 61. Hence an area of the heat dissipation region 33 is larger than an area of the electrical connection region 34.

The sealing resin body 24 is arranged in the groove 35 of the first heatsink 31, and an insulating separator 28 is configured with the sealing resin body 24. The insulating separator 28 is coupled with the other portion of the sealing resin body 24. Similarly to the other portion of the front surface 25 of the sealing resin body 24, a surface of the insulating separator 28 is also substantially flush with the exposed surface 32.

On the semiconductor chip 20, the emitter electrode is formed in portion of the second main surface 23. The emitter electrode is electrically, thermally, and mechanically connected with a terminal 36 via the solder 30. The terminal 36 is located in the middle of thermal conduction and electrical conduction paths between a second heatsink 39 (to be described later) and the respective semiconductor chips 20, 21. Hence the terminal 36 is formed using at least a metal material so as to ensure the thermal conductivity and the electrical conductivity. For example, the terminal 36 is formed of a metal material excellent in thermal conductivity and electrical conductivity, such as copper or molybdenum. Although not shown in the drawings, the anode electrode of the semiconductor chip 21 is also connected electrically, thermally, and mechanically with a terminal via solder.

Further, an external connection pad (not shown) is formed in portion of a peripheral region on the second main surface 23 of the semiconductor chip 20, except for the emitter electrode forming area. In the present embodiment, not only the gate electrode pad is formed as the pad, but there are also formed a Kelvin emitter pad to detect a potential of the emitter electrode, a pad for an anode potential of a thermosensitive diode (temperature-sensitive diode) to detect a temperature of a semiconductor element, a pad for a cathode potential of the same diode, and a current sensing pad. A signal terminal 38 is electrically connected to the pad via a bonding wire 37. The signal terminal 38 is extended in the Y-direction as shown in FIG. 2. Part of the signal terminal 38 projects outside from one of the side surfaces 27 of the sealing resin body 24. In this manner, the signal terminal 38 can establish an electrical connection with an external apparatus. The side surface 27 from which the signal terminal 38 projects is a plane (Z-X plane) orthogonal to a direction in which the heat dissipation region 33 and the electrical connection region 34 are arranged side by side, and is a plane facing the heat dissipation region 33.

The second heatsink 39 is electrically, thermally, and mechanically connected with a surface the terminal 36 opposite to the semiconductor chip 20, via the solder 30. Likewise, a terminal facing the semiconductor chip 21 is also connected electrically, thermally, and mechanically with the second heatsink 39 via solder.

The second heatsink 39 performs a function of dissipating the heat generated by the semiconductor chips 20, 21 to the outside of the semiconductor device 10, and a function of electrically relaying between the semiconductor chips 20, 21 and a second bus bar 62 (to be described later). This second heatsink 39 has a similar configuration to that of the first heatsink 31. The second heatsink 39 is provided to mostly overlap the first heatsink 31 as seen in projection view from the Z-direction. For example, the second heatsink 39 may be configured to be almost superimposed on the first heatsink 31.

The second heatsink 39 is formed using at least a metal material so as to ensure the thermal conductivity and electrical conductivity. Of surfaces of the second heatsink 39, a side surface and a region, which is a surface facing the semiconductor chips 20, 21 and is not arranged with the solder 30, are covered with the sealing resin body 24. On the other hand, a surface of the second heatsink 39 opposite to the semiconductor chips 20, 21 is an exposed surface 40 exposed from the rear surface 26 of the sealing resin body 24. This exposed surface 40 is almost flush with the rear surface 26.

Similarly to the exposed surface 32, the exposed surface 40 of the second heatsink 39 has a heat dissipation region 41 and an electrical connection region 42. The exposed surface 40 is divided by a groove 43 into two sections in the Y-direction. The groove 43 is formed from one end toward the other end of the second heatsink 39 along the X-direction. The exposed surface 40 is divided by this groove 43 into the heat dissipation region 41 and the electrical connection region 42. The heat dissipation region 41 and the electrical connection region 42 are both formed in a planar rectangular shape.

The heat dissipation region 41 includes a region overlapping the semiconductor chips 20, 21 as seen in projection view from the Z-direction. In other words, the heat dissipation region 41 is defined to overlap the semiconductor chips 20, 21 in the coordinate system orthogonal to the Z-direction. In the present embodiment, the heat dissipation region 41 is almost superimposed on the heat dissipation region 33 as seen in projection view from the Z-direction. A second cooler 64 (to be described later) is thermally connected to the heat dissipation region 41. Hence the heat dissipation region 41 of the exposed surface 40 contributes to the heat dissipation from the semiconductor chips 20, 21.

Meanwhile, the electrical connection region 42 is a portion of the exposed surface 40 other than the heat dissipation region 41. The electrical connection region 42 is a region not overlapping the semiconductor chips 20, 21 as seen in projection view from the Z-direction. In other words, the electrical connection region 42 is defined not to overlap the semiconductor chips 20, 21 in the coordinate system orthogonal to the Z-direction. The second bus bar 62 is electrically connected to the electrical connection region 42 by welding or the like. In this manner, the electrical connection region 42 of the exposed surface 40 contributes to the electrical connection (relay) between the semiconductor chips 20, 21 and the second bus bar 62.

In the present embodiment, in the Y-direction, the electrical connection region 42 is located more distant than the heat dissipation region 41 from a surface, from which the signal terminal 38 projects, of the side surface 27 of the sealing resin body 24. That is, the heat dissipation region 41 and the electrical connection region 42 are arranged side by side in the same pattern as the heat dissipation region 33 and the electrical connection region 34 on the exposed surface 32. The electrical connection region 42 and the electrical connection region 34 are in the positional relation of overlapping each other as seen in projection view from the Z-direction. In the present embodiment, as one example, the electrical connection regions 34, 42 are almost superimposed on each other.

Note that the larger heat dissipation region 41 is more preferable in terms of the heat dissipation from the semiconductor chips 20, 21. Meanwhile, the electrical connection region 42 may ensure the connection with the second bus bar 62. Hence an area of the heat dissipation region 41 is larger than an area of the electrical connection region 42.

The sealing resin body 24 is arranged also in the groove 43 of the second heatsink 39, and an insulating separator 29 is configured with the sealing resin body 24. This insulating separator 29 is also coupled with the other portion of the sealing resin body 24. Similarly to the other portion of the rear surface 26 of the sealing resin body 24, the surface of the insulating separator 29 is on substantially flush with the exposed surface 40. Hereinafter, the first heatsink 31 and the second heatsink 39 are also referred to as heatsinks 31, 39.

Next, a description is given of the power module 60 including the semiconductor device 10 described above.

As shown in FIGS. 2 and 3, the power module 60 includes the first bus bar 61, the second bus bar 62, the first cooler 63, the second cooler 64, and insulating plates 65. Hereinafter, the first bus bar 61 and the second bus bar 62 are also referred to as bus bars 61, 62. Further, the first cooler 63 and the second cooler 64 are also referred to as coolers 63, 64.

The first bus bar 61 and the second bus bar 62 are each formed using a conductive material such as copper, and are electrically connected to the electrical connection regions 34, 42 of the corresponding heatsinks 31, 39 by welding or the like. When the semiconductor device 10 is on the upper-arm side, the first bus bar 61 connected to the electrical connection region 34 of the first heatsink 31 constitutes at least part of the high-potential power line 104. Specifically, the first bus bar 61 electrically relays between the positive electrode of the smoothing capacitor 103 and each of the collector electrode of the semiconductor chip 20 and the cathode electrode of the semiconductor chip 21. The second bus bar 62 connected to the electrical connection region 42 of the second heatsink 39 constitutes at least part of the three-phase line 106. Specifically, the second bus bar 62 electrically relays between the motor 102 and each of the emitter electrode of the semiconductor chip 20 and the anode electrode of the semiconductor chip 21.

When the semiconductor device 10 is on the lower-arm side, the first bus bar 61 constitutes at least part of the three-phase line 106. The second bus bar 62 constitutes at least part of the low-potential power line 105. Specifically, the second bus bar 62 electrically relays between the negative electrode of the smoothing capacitor 103 and each of the emitter electrode of the semiconductor chip 20 and the anode electrode of the semiconductor chip 21.

The bus bars 61, 62 are both flat plates and are formed in a rectangular shape as seen in plan view with a longitudinal side in the Y-direction. The bus bars 61, 62 are extended from the corresponding electrical connection regions 34, 42 to the outside of the semiconductor device 10 in the opposite direction to the heat dissipation regions 33, 41. Further, as seen in projection view from the Z-direction, the first bus bar 61 and the second bus bar 62 are in the positional relation of overlapping each other.

For example, coolant is allowed to flow inside the first cooler 63 and the second cooler 64, and general coolant configured to effectively dissipate the heat from the semiconductor device 10 can be employed. The first cooler 63 is arranged corresponding to the heat dissipation region 33 of the first heatsink 31. The second cooler 64 is arranged corresponding to the heat dissipation region 41 of the second heatsink 39.

The insulating plates 65 are respectively interposed between the coolers 63, 64 and the corresponding heat dissipation regions 33, 41. Each of the insulating plates 65 has an insulating property of electrically insulating between the semiconductor device 10 and the coolers 63, 64, and has thermal conductivity of favorably transmitting the heat from the semiconductor device 10 to the coolers 63, 64. Such an insulating plate 65 is formed using ceramic such as silicon nitride or alumina, and has a predetermined thickness so as to ensure the above insulating property and thermal conductivity.

One of the insulating plate 65 is arranged facing the front surface 25 in the Z-direction so as to oppose the heat dissipation region 33 of the exposed surface 32 of the first heatsink 31. Further, the other insulating plate 65 is arranged facing the rear surface 26 in the Z-direction so as to oppose the heat dissipation region 41 of the exposed surface 40 of the second heatsink 39. The insulating plates 65 are fixed to the corresponding heat dissipation regions 33, 41 and coolers 63, 64 via silicone-based grease, for example.

The insulating separator 28 made up of the sealing resin body 24 is interposed between the first bus bar 61 and the first cooler 63. That is, a clearance exists between the first bus bar 61 and the first cooler 63 in the Y-direction. Further, the insulating separator 29 made up of the sealing resin body 24 is interposed between the second bus bar 62 and the second cooler 64. That is, a clearance exists between the second bus bar 62 and the second cooler 64 in the Y-direction.

Next, a method for manufacturing the semiconductor device 10 is simply described. In the present embodiment, as one example, there is shown an example where the sealing resin body 24 is cut after being molded to expose the exposed surfaces 32, 40. As for the method for manufacturing the semiconductor device 10, for example, the description in JP 2007-27794 A can be applied by reference.

First, each of the semiconductor chips 20, 21, the heatsinks 31, 39, the terminal 36, and the signal terminal 38 is prepared. At this time, the heatsinks 31, 39 with the grooves 35, 43 formed therein are prepared.

Next, a connection process is performed before molding of the sealing resin body 24. In this connection process, the first heatsink 31 and the semiconductor chips 20, 21 are connected with each other via the solder 30. Further, the semiconductor chips 20, 21 and the terminal 36 are connected with each other via the solder 30. Subsequently, the signal terminal 38 and the pad for the semiconductor chip 20 are connected with each other by a bonding wire 37. Moreover, the terminal 36 and the second heatsink 39 are connected with each other via the solder 30.

Next, a structure formed through the above connection process is arranged in a mold die (not shown), and resin is inserted into a cavity of the mold die to form the sealing resin body 24. In this molding process, the sealing resin body 24 is molded by transfer molding by use of epoxy resin. At this time, the sealing resin body 24 is molded so as to completely cover the heatsinks 31, 39.

Next, a cutting process is performed. In this cutting process, the sealing resin body 24 is pressed from both sides in the X-direction while the side surface 27 of the sealing resin body 24 is subjected to vacuum chucking using a press jig (not shown). In this state, the front surface 25 of the sealing resin body 24 is cut together with the first heatsink 31. Subsequently, the rear surface 26 is cut together with the second heatsink 39.

By this cutting, the exposed surfaces 32, 40 of the heatsinks 31, 39 are exposed from the sealing resin body 24. Further, in the present embodiment, the exposed surface 32 is substantially flush with the peripheral front surface 25, and the exposed surface 40 is substantially flush with the peripheral rear surface 26. In this cutting, the cutting is performed at positions shallower than the bottoms of the grooves 35, 43, and hence the grooves 35, 43 and the insulating separators 28, 29 are left after the cutting.

Since the heatsinks 31, 39 formed using the metal material and the sealing resin body 24 are different in hardness of the constituent material, some difference in amount of cutting is generated therebetween. In practice, a step difference of not larger than several micrometers (e.g., not larger than 2 μm) is generated between the exposed surface 32 and the front surface 25 and between the exposed surface 40 and the rear surface 26. However, the step difference is not larger than several micrometers, and a state where such a minute step difference exists is regarded as a state where the surfaces are substantially flush with each other.

After cutting of tie bars in a lead frame (not shown), the semiconductor device 10 can be obtained.

Next, a description is given of advantageous effects by the semiconductor device 10 and power module 60.

In the present embodiment, the coolers 63, 64 are thermally connected respectively to the heat dissipation regions 33, 41 on the exposed surfaces 32, 40 of the respective heatsinks 31, 39. It is thus possible to dissipate the heat from the semiconductor chips 20, 21 to both the sides of the semiconductor device 10.

Further, the bus bars 61, 62 are electrically connected respectively to the electrical connection regions 34, 42 on the exposed surfaces 32, 40 of the respective heatsinks 31, 39. As thus described, the bus bars 61, 62 are connected to the heatsinks 31, 39 without external connection terminals (outer leads). Since no external connection terminal is provided, it is possible to reduce an increase in inductance caused by a thin terminal. That is, a surge voltage that occurs at the time of switching can be suppressed.

Further, the electrical connection region 34 of the exposed surface 32 and the electrical connection region 42 of the exposed surface 40 are in the positional relation of overlapping each other as seen in projection view from the Z-direction. For this reason, the first bus bar 61 connected to the electrical connection region 34 and the second bus bar 62 connected to the electrical connection region 42 are also in the positional relation of overlapping each other as seen in projection view from the Z-direction. In the first bus bar 61 and the second bus bar 62, directions in which a current flows are reversed to each other, thereby enabling enhancement of the effect of mutually cancelling magnetic fluxes. Hence it is possible to reduce parasitic inductance. That is, it is possible to suppress a surge voltage at the time of switching.

Further, on the exposed surface 32, the heat dissipation region 33 and the electrical connection region 34 are separated from each other by the sealing resin body 24. Accordingly, a creeping distance between the first bus bar 61 and the first cooler 63 can be gained as compared with a configuration where the sealing resin body 24 is not arranged between the heat dissipation region 33 and the electrical connection region 34, such as a configuration where the heat dissipation region 33 and the electrical connection region 34 are continuously arranged. Further, the contact (short circuit) between the first bus bar 61 and the first cooler 63 can be inhibited. Likewise, on the exposed surface 40, the heat dissipation region 41 and the electrical connection region 42 are separated from each other by the sealing resin body 24. The effect by this separation is the same as described above.

Particularly in the present embodiment, the first heatsink 31 has the groove 35 between the heat dissipation region 33 and the electrical connection region 34, and the sealing resin body 24 is arranged in the groove 35, to form the insulating separator 28. Likewise, the second heatsink 39 has the groove 43 between the heat dissipation region 41 and the electrical connection region 42, and the sealing resin body 24 is arranged in the groove 43, to form the insulating separator 29. In this manner, the heat dissipation regions 33, 41 and the electrical connection regions 34, 42 are separated from each other by the insulating separators 28, 29 of the sealing resin body 24. As described above, in the present embodiment, the sealing resin body 24 is cut after being molded to expose the exposed surfaces 32, 40. By employing this method, the heat dissipation regions 33, 41 and the electrical connection regions 34, 42 can be separated from each other without adding a new process. This thus enables simplification of the manufacturing process.

Although the example of exposing the exposed surfaces 32, 40 by the cutting has been shown in the present embodiment, the exposed surfaces 32, 40 can be exposed without cutting. For example, the sealing resin body 24 may be molded in a state where the exposed surfaces 32, 40 of the heatsinks 31, 39 are each pressed onto and closely attached to the cavity wall surface of the mold die. In this case, at the point of molding the sealing resin body 24, the exposed surfaces 32, 40 are exposed from the sealing resin body 24. Further, the insulating separators 28, 29 are also formed. Accordingly, while the mold die shape is simplified, the cutting process can be eliminated to simplify the manufacturing process.

Second Embodiment

In the present embodiment, descriptions of portions in common with those of the semiconductor device 10 and the power module 60 in the first embodiment are omitted.

In the first embodiment, the example has been shown where the semiconductor device 10 has one of six arms constituting the three-phase inverter. That is, the semiconductor device 10 of the 1-in-1 package structure has been shown in the first embodiment. In contrast to this, the present embodiment is different in that a semiconductor device 10 has a 2-in-1 package structure as shown in FIGS. 4, 5, 6, 7, and 8. That is, the semiconductor device 10 has upper and lower arms for one of three phases.

The semiconductor device 10 includes semiconductor chips 20*a*, 20*b*, a sealing resin body 24, first heatsinks 31*a*, 31*b*, terminals 36*a*, 36*b*, signal terminals 38*a*, 38*b*, and second heatsinks 39*a*, 39*b*. The semiconductor chips 20*a*, 20*b* correspond to the semiconductor chip 20 described in the first embodiment, and the first heatsinks 31*a*, 31*b* corresponds to the first heatsink 31. Further, the terminals 36*a*, 36*b* correspond to the terminal 36, and the signal terminals 38*a*, 38*b* correspond to the signal terminal 38. The second heatsinks 39*a*, 39*b* correspond to the second heatsink 39.

An IGBT element and an FWD element on the upper-arm side are configured on the semiconductor chip 20*a*, and an IGBT element and an FWD element on the lower-arm side are configured on the semiconductor chip 20*b*. The IGBT element and the FWD element may be formed on different semiconductor chips as in the first embodiment. These semiconductor chips 20*a*, 20*b* have shapes almost the same as each other. The semiconductor chips 20*a*, 20*b* are arranged side by side in the X-direction, and are arranged at almost the same positions in the Z-direction.

The semiconductor chips 20*a*, 20*b* each have a collector electrode (also used as a cathode electrode) as a first main electrode on a side of a first main surface 22, and an emitter electrode (also used as an anode electrode) as a second main electrode on a side of a second main surface 23. In the semiconductor chips 20a, 20b, the collector electrode is formed almost over the first main surface 22. The collector electrode of the semiconductor chip 20a is electrically, thermally, and mechanically connected with the first heatsink 31a via the solder 30. Likewise, the collector electrode of the semiconductor chip 20b is electrically, thermally, and mechanically connected with the first heatsink 31b via the solder 30.

The first heatsink 31a performs a function of dissipating heat generated by the semiconductor chip 20a to the outside of the semiconductor device 10, and a function of electrically relaying between the semiconductor chip 20a and a first bus bar 61a (to be described later). Of surfaces of the first heatsink 31a; a surface opposite to a surface opposing the semiconductor chip 20a is an exposed surface 32a exposed from a front surface 25 of the sealing resin body 24. This exposed surface 32a is almost flush with the front surface 25 of the sealing resin body 24. Similarly, the first heatsink 31b performs a function of dissipating heat generated by the semiconductor chip 20b to the outside of the semiconductor device 10, and a function of electrically relaying between the semiconductor chip 20b and a first bus bar 61b (to be described later). Of surfaces of the first heatsink 31b, a surface opposite to a surface opposing the semiconductor chip 20b is an exposed surface 32b exposed from the front surface 25 of the sealing resin body 24. This exposed surface 32b is also almost flush with the front surface 25 of the sealing resin body 24.

The exposed surface 32a of the first heatsink 31a has a heat dissipation region 33a and an electrical connection region 34a. In the present embodiment, a groove 35a is formed in the first heatsink 31, and the exposed surface 32a is divided into two sections in the Y-direction by the groove 35a. The groove 35a is formed from one end toward the other end of the first heatsink 31a along the X-direction. The exposed surface 32a is divided by this groove 35a into the heat dissipation region 33a and the electrical connection region 34a. Similarly, the exposed surface 32b of the first heatsink 31b has a heat dissipation region 33b and an electrical connection region 34b. A groove 35b is formed in the first heatsink 31. The groove 35b is formed from one end toward the other end of the first heatsink 31b along the X-direction. The exposed surface 32b is divided by this groove 35b into the heat dissipation region 33b and the electrical connection region 34b.

The heat dissipation region 33a is defined to overlap the semiconductor chip 20a as seen in projection view from the Z-direction. A first cooler 63 is thermally connected to the heat dissipation region 33a. Similarly, the heat dissipation region 33b is defined to overlap the semiconductor chip 20b as seen in projection view from the Z-direction. The first cooler 63 is thermally connected to the heat dissipation region 33b. The heat dissipation regions 33a, 33b are located at almost the same positions in the Y-direction and are arranged side by side in the X-direction.

Meanwhile, the electrical connection region 34a is a portion of the exposed surface 32a other than the heat dissipation region 33a. The electrical connection region 34a is a region not overlapping the semiconductor chip 20a as seen in projection view from the Z-direction. The first bus bar 61a is electrically connected to the electrical connection region 34a. In the Y-direction, the electrical connection region 34a is located more distant than the heat dissipation region 33a from a surface, from which a signal terminal 38a (to be described later) projects, of a side surface 27 of the sealing resin body 24. Similarly, the electrical connection region 34b is a portion of the exposed surface 32b other than the heat dissipation region 33b. The electrical connection region 34b is a region not overlapping the semiconductor chip 20b as seen in projection view from the Z-direction. The first bus bar 61b is electrically connected to the electrical connection region 34b. In the Y-direction, the electrical connection region 34b is located more distant than the heat dissipation region 33b from a surface, from which a signal terminal 38b (to be described later) projects, of the side surface 27 of the sealing resin body 24. The electrical connection regions 34a, 34b are located at almost the same positions in the Y-direction and are arranged side by side in the X-direction.

The sealing resin body 24 is arranged in the grooves 35a, 35b of the first heatsinks 31a, 31b, and insulating separators 28a, 28b are configured with the sealing resin body 24. Similarly to the other portion of the front surface 25 of the sealing resin body 24, surfaces of the insulating separators 28a, 28b are also substantially flush with the exposed surfaces 32a, 32b.

On the semiconductor chips 20a, 20b, the emitter electrodes are formed in portions of the respective second main surfaces 23. The emitter electrode of the semiconductor chip 20a is electrically, thermally, and mechanically connected with the terminal 36a via the solder 30. Similarly, the emitter electrode of the semiconductor chip 20b is electrically, thermally, and mechanically connected with the terminal 36b via the solder 30.

The signal terminal 38a is electrically connected to the pad for the semiconductor chip 20a via the bonding wire 37. The signal terminal 38a is extended in the Y-direction. Part of the signal terminal 38a projects outward from one of the side surfaces 27 of the sealing resin body 24. Similarly, the signal terminal 38b is electrically connected to the pad for the semiconductor chip 20b via the bonding wire 37. The signal terminal 38b is also extended in the Y-direction. Part of the signal terminal 38b projects outward from the same surface as the surface from which the signal terminal 38a projects, of the side surfaces 27 of the sealing resin body 24.

A second heatsink 39a is electrically, thermally, and mechanically connected with a surface of the terminal 36a opposite to the semiconductor chip 20a, via the solder 30. Similarly, the second heatsink 39b is electrically, thermally, and mechanically connected with a surface of the terminal 36b opposite to the semiconductor chip 20b, via the solder 30.

The second heatsink 39a performs a function of dissipating heat generated by the semiconductor chip 20a to the outside of the semiconductor device 10. The second heatsink 39a is provided to overlap the first heatsink 31a as seen in projection view from the Z-direction. The second bus bar 62 is not connected to the second heatsink 39a.

The second heatsink 39b performs a function of dissipating heat generated by the semiconductor chip 20b to the outside of the semiconductor device 10, and a function of electrically relaying between the semiconductor chip 20b and a second bus bar 62. The second heatsink 39b is provided to overlap the first heatsink 31b as seen in projection view from the Z-direction.

Of surfaces of the second heatsink 39a, a surface opposite to a surface facing the semiconductor chip 20a is an exposed surface 40a exposed from a rear surface 26 of the sealing resin body 24. This exposed surface 40a is almost flush with the rear surface 26. The second heatsink 39a has a heat dissipation region 41a as the exposed surface 40a. That is, the second heatsink 39a has no electrical connection region.

Of the surfaces of the second heatsink 39b, a surface opposite to a surface facing the semiconductor chip 20b is an exposed surface 40b exposed from the rear surface 26 of the sealing resin body 24. This exposed surface 40b is almost flush with the rear surface 26. The second heatsink 39b has a heat dissipation region 41b and an electrical connection region 42b as the exposed surface 40b. The exposed surface 40b is divided by a groove 43 into two sections in the Y-direction. The groove 43 is formed from one end toward the other end of the second heatsink 39b along the X-direction. The exposed surface 40b is divided by this groove 43 into the heat dissipation region 41b and the electrical connection region 42b. The heat dissipation region 41b and the electrical connection region 42b are both formed in a rectangular shape as seen in plan view. The electrical connection region 42b is extended in the X-direction.

The heat dissipation region 41a is defined to overlap the semiconductor chip 20a as seen in projection view from the Z-direction. In the present embodiment, the heat dissipation region 41a is almost superimposed on the heat dissipation region 33a as seen in projection view from the Z-direction. A second cooler 64 is thermally connected to the heat dissipation region 41a. Similarly, the heat dissipation region 41b is defined to overlap the semiconductor chip 20b as seen in projection view from the Z-direction. In the present embodiment, the heat dissipation region 41b is almost superimposed on the heat dissipation region 33b as seen in projection view from the Z-direction. The second cooler 64 is also connected thermally to the heat dissipation region 41b. The heat dissipation regions 41a, 41b are located at almost the same positions in the Y-direction and are arranged side by side in the X-direction.

The electrical connection region 42 is a region not overlapping the semiconductor chip 20b as seen in projection view from the Z-direction. The second bus bar 62 is electrically connected to the electrical connection region 42. The electrical connection region 42b is extended in the X-direction. Specifically, the electrical connection region 42b is extended to a position where the electrical connection region 42b overlaps the electrical connection region 34a in the coordinate system orthogonal to the Z-direction.

The sealing resin body 24 is arranged also in the groove 43 of the second heatsink 39b, and the insulating separator 29 is configured with the sealing resin body 24. Similarly to the other portion of the rear surface 26 of the sealing resin body 24, the surface of the insulating separator 29 is substantially flush with the exposed surface 40.

Figure 6:
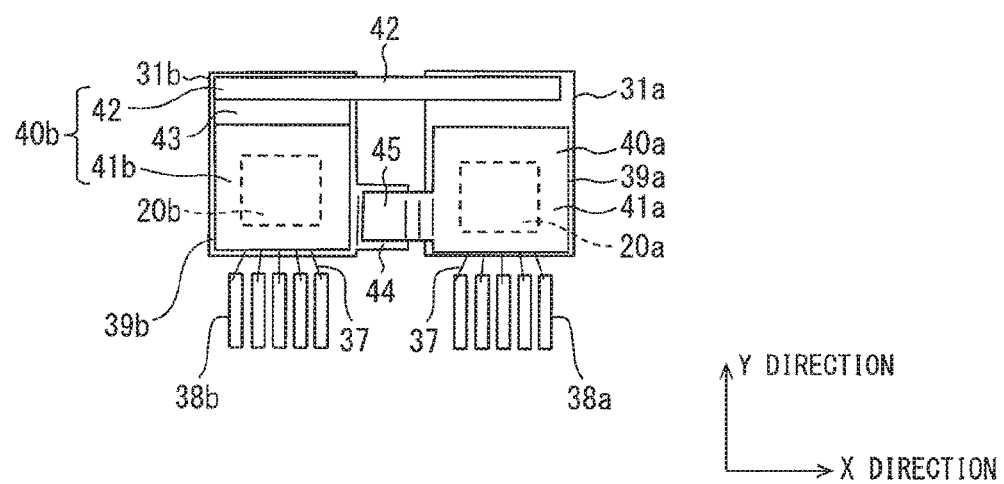
FIG. 6 is a plan view of the semiconductor device in FIG. 4 with a sealing resin body omitted from the semiconductor device.
Figure 7:
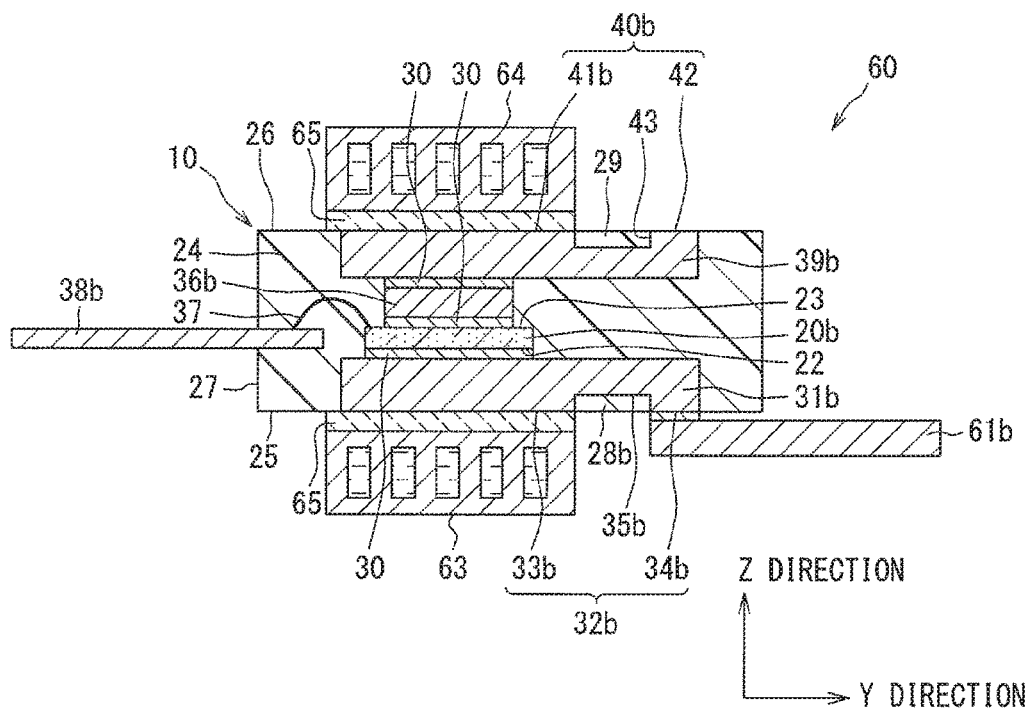
FIG. 7 is a sectional view taken along line VII-VII in FIG. 4.
Figure 8:
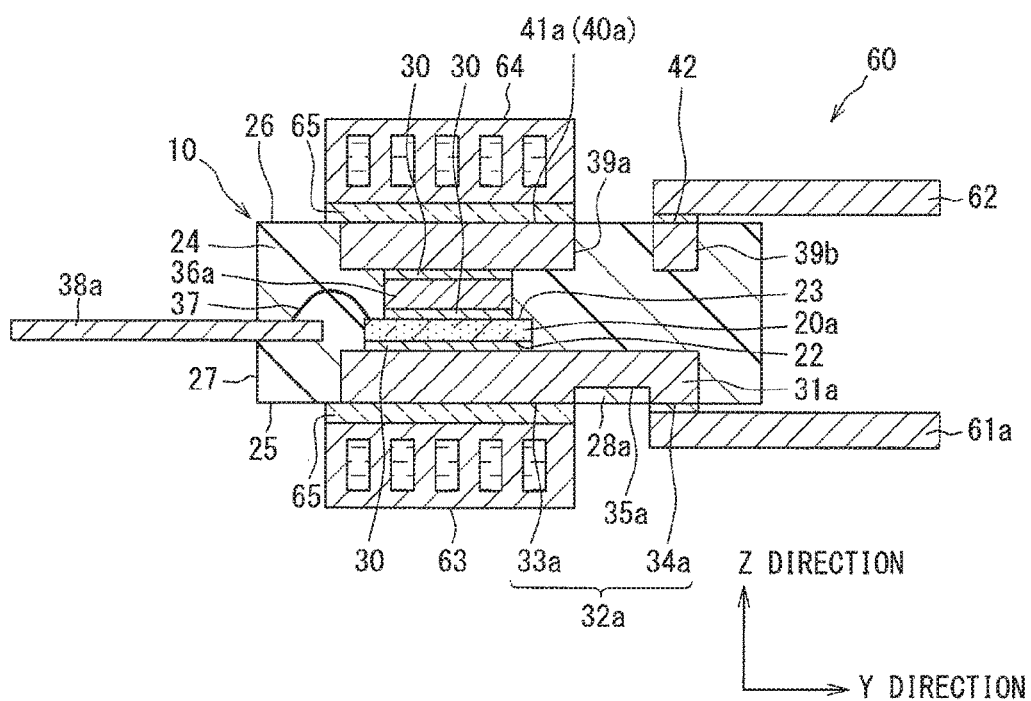
FIG. 8 is a sectional view taken along line VIII-VIII in FIG. 4.

Further, the semiconductor device 10 has joints 44, 45 as shown in FIG. 6. The joint 44 is extended from the first heatsink 31b toward the first heatsink 31a in the X-direction. Further, the joint 45 is extended from the second heatsink 39a toward the second heatsink 39b in the X-direction. The joints 44, 45 are electrically and mechanically connected with each other by solder (not shown). The joints 44, 45 are entirely covered with the sealing resin body 24. Note that there may be employed a configuration where a joint is formed in one of the first heatsink 31b and the second heatsink 39a. Such a joint structure to connect the upper arm and the lower arm is known, and hence the detailed description thereof is omitted.

Next, a description is given of a power module 60 including the semiconductor device 10 described above.

As shown in FIGS. 4, 5, 7, and 8, the power module 60 includes the first bus bars 61a, 61b, the second bus bar 62, the first cooler 63, the second cooler 64, and insulating plates 65. The first bus bars 61a, 61b correspond to the first bus bar 61 of the first embodiment. Hereinafter, the first bus bars 61a, 61b are also referred to as bus bars 61a, 61b.

The first bus bar 61a constitutes at least part of the high-potential power line 104. The first bus bar 61a is connected to the electrical connection region 34a of the first heatsink 31a. The first bus bar 61b constitutes at least part of a three-phase line 106. The first bus bar 61b is connected to the electrical connection region 34b of the first heatsink 31b.

As thus described, the first bus bars 61a, 61b are both arranged on a side of the front surface 25 of the sealing resin body 24. The first bus bars 61a, 61b are both flat plates and are formed in a rectangular shape as seen in plan view with a longitudinal side in the Y-direction. The bus bars 61a, 61b are extended from the corresponding electrical connection regions 34a, 34b to the outside of the semiconductor device 10 in the opposite direction to the heat dissipation regions 33a, 33b. That is, the first bus bars 61a, 61b are the same in the longitudinal direction and are arranged side by side in the X-direction.

The second bus bar 62 constitutes at least part of the low-potential power line 105. The second bus bar 62 is connected to the electrical connection region 42 of the second heatsink 39b. In this manner, the second bus bar 62 is arranged on a side of the rear surface 26 of the sealing resin body 24. The second bus bar 62 is a flat plate and is formed in a rectangular shape as seen in plan view with a longitudinal side in the Y-direction. The bus bar 62 is extended from the electrical connection region 42 to the outside of the semiconductor device 10 in the opposite direction to the heat dissipation region 41b. Further, the bus bar 62 is connected to the portion of the electrical connection region 42 which overlaps the electrical connection region 34a as seen in projection view from the Z-direction. That is, as seen in projection view from the Z-direction, the first bus bar 61a and the second bus bar 62 are in the positional relation of overlapping each other.

Note that the first cooler 63 is arranged on the heat dissipation regions 33a, 33b via the insulating plates 65. Further, the second cooler 64 is arranged on the heat dissipation regions 41a, 41b via the insulating plates 65. The insulating separator 28a is interposed between the first bus bar 61a and the first cooler 63. Likewise, the insulating separator 28b is interposed between the first bus bar 61b and the first cooler 63. Further, the insulating separator 29 is interposed between the second bus bar 62 and the second cooler 64.

The semiconductor device 10 of the 2-in-1 package structure configured as described above and the power module 60 including the semiconductor device 10 can also exert equivalent advantageous effects to the advantageous effects described in the first embodiment. Note that only the heatsink connected to the bus bar has the heat dissipation region and the electrical connection region as the exposed surface. In the present embodiment, the bus bars 61a, 61b, 62 are connected only to the first heatsinks 31a, 31b and the second heatsink 39b, of the first heatsinks 31a, 31b and the second heatsinks 39a, 39b. Hence the second heatsink 39a only has the heat dissipation region 41a as the exposed surface 40a.

Note that the bus bar constituting the three-phase line 106 may be connected to at least one of the first heatsink 31b and the second heatsink 39a.

In the present embodiment, the first bus bar 61b constituting the three-phase line 106 is connected only to the first heatsink 31b. With the second heatsink 39a having no electrical connection region, the electrical connection region 42 of the second heatsink 39b is extended to an empty space. Hence the electrical connection region 42 overlaps the electrical connection region 34a as seen in projection view from the Z-direction. Further, as seen in projection view from the Z-direction, the first bus bar 61a and the second bus bar 62 are in the positional relation of overlapping each other.

The first bus bar 61a constituting the high-potential power line 104 and the second bus bar 62 constituting the low-potential power line 105 are in the positional relation of overlapping each other, thereby enabling further enhancement of the effect of mutually cancelling magnetic fluxes. For example, as compared with a configuration where the bus bar constituting the high-potential power line 104 and the bus bar constituting the three-phase line 106 are in the positional relation of overlapping each other, it is possible to enhance the effect of mutually cancelling magnetic fluxes. Similarly, as compared with a configuration where the bus bar constituting the low-potential power line 105 and the bus bar constituting the three-phase line 106 are in the positional relation of overlapping each other, it is possible to enhance the effect of mutually cancelling magnetic fluxes.

However, for example, it is possible to employ a configuration where the first bus bar 61b constituting the three-phase line 106 and the second bus bar 62 constituting the low-potential power line 105 overlap each other. Further, it is also possible to employ a configuration where the second heatsink 39a has an electrical connection region as the exposed surface 40a, and the bus bar constituting the three-phase line 106 is connected to this electrical connection region.

Third Embodiment

In the present embodiment, descriptions of portions in common with those of the semiconductor device 10 and the power module 60 in the first embodiment are omitted.

In the first embodiment, the example of using the plate-shaped bus bars 61, 62 has been shown. In contrast to this, in the present embodiment, at least one of bus bars 61 and 62 is bent. Hereinafter, one example of the bending structure is shown.

Figure 9:
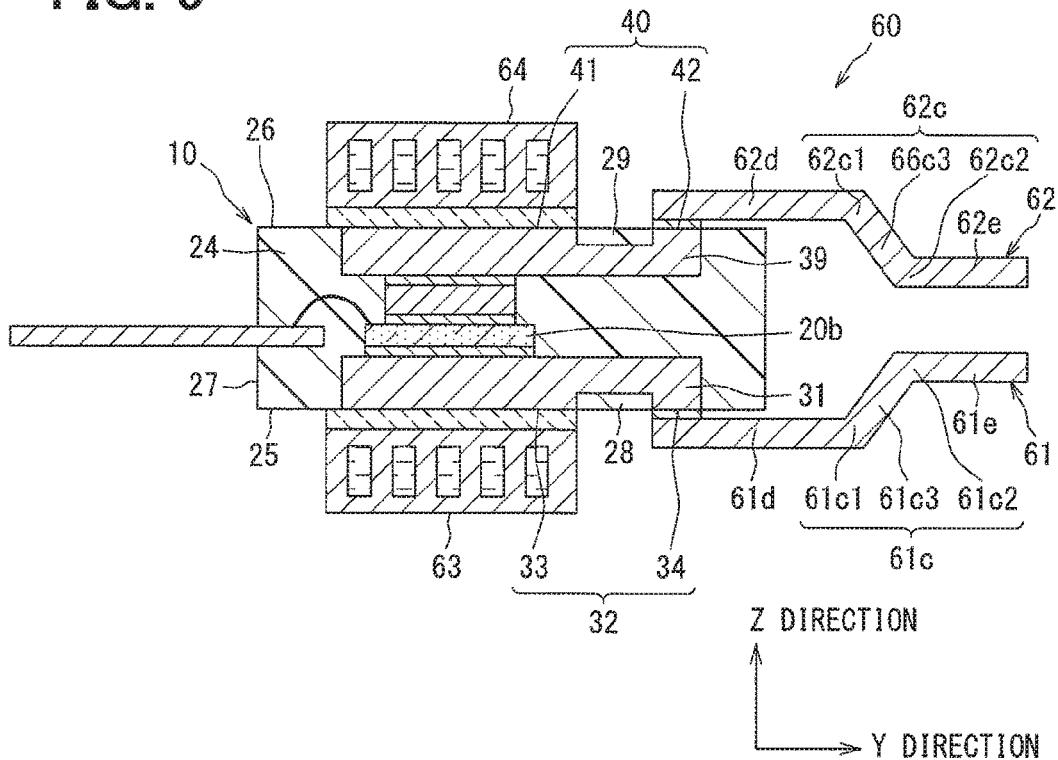
FIG. 9 is a sectional view showing a schematic configuration of a power module including a semiconductor device according to a third embodiment, and corresponds to FIG. 3.

In a power module 60 shown in FIG. 9, both the first bus bar 61 and the second bus bar 62 are bent. The first bus bar 61 has a bent part 61c located more outward than the semiconductor device 10 in the Y-direction that is the extending direction of the first bus bar 61. This bent part 61c couples between a first planar part 61d and a second planar part 61e. The first planar part 61d is a planar portion extended in the Y-direction, with the thickness direction thereof set in the Z-direction. The second planar part 61e is also a planar portion extended in the Y-direction, with the thickness direction thereof set in the Z-direction.

The bent part 61c has a first bent part 61c1, a second bent part 61c2, and a link part 61c3. The first bus bar 61 is bent in the first bent part 61c1. The link part 61c3 is extended toward the rear surface 26 while being inclined in the Y-direction. Further, the first bus bar 61 is bent at the second bent part 61c2. The second planar part 61e is extended in the Y-direction. That is, the first planar part 61d and the second planar part 61e are substantially parallel to each other.

Similarly, the second bus bar 62 has a bent part 62c located more outward than the semiconductor device 10 in the Y-direction that is the extending direction of the second bus bar 62. This bent part 62c couples between a first planar part 62d and a second planar part 62e. The first planar part 62d is a planar portion extended in the Y-direction, with the thickness direction thereof set in the Z-direction. The second planar part 62e is also a planar portion extended in the Y-direction, with the thickness direction thereof set in the Z-direction.

The bent part 62c has a first bent part 62c1, a second bent part 62c2, and a link part 62c3. The second bus bar 62 is bent at the first bent part 62c1. The link part 62c3 is extended toward a front surface 25 while being inclined in the Y-direction. Further, the second bus bar 62 is bent at the second bent part 62c2. The second planar part 62e is extended in the Y-direction. That is, the first planar part 62d and the second planar part 62e are substantially parallel to each other.

By having the bent parts 61c, 62c, a clearance between the first bus bar 61 and the second bus bar 62 opposing each other (a distance in the Z-direction) is narrower at the outside of the semiconductor device 10 than that at a position where the first bus bar 61 and the second bus bar 62 overlap the semiconductor device 10. Specifically, a clearance between the second planar parts 61e, 62e opposing each other is narrower than a clearance between the first planar parts 61d, 62d opposing each other.

Employing the configuration where the first bus bar 61 and the second bus bar 62 are bent to approach each other in the Z-direction enables further enhancement of the effect of mutually cancelling magnetic fluxes.

Although the example has been shown in the present embodiment where both the first bus bar 61 and the second bus bar 62 are bent, the first bus bar 61 and the second bus bar 62 may be made closer to each other by bending one of the bus bars 61, 62. Further, the bent shape is not restricted to the above example.

The configuration shown in the present embodiment is also applicable to the configuration shown in the second embodiment.

Fourth Embodiment

In the present embodiment, descriptions of portions in common with those of the semiconductor device 10 and the power module 60 in the first embodiment are omitted.

In the present embodiment, a semiconductor device 10 further includes a spacer interposed between a first heatsink 31 and a second heatsink 39 in correspondence with electrical connection regions 34, 42, and configured to electrically separate the first heatsink 31 and the second heatsink 39 from each other while being connected to the respective heatsinks 31, 39. Hereinafter, one example of the spacer is shown.

Figure 10:
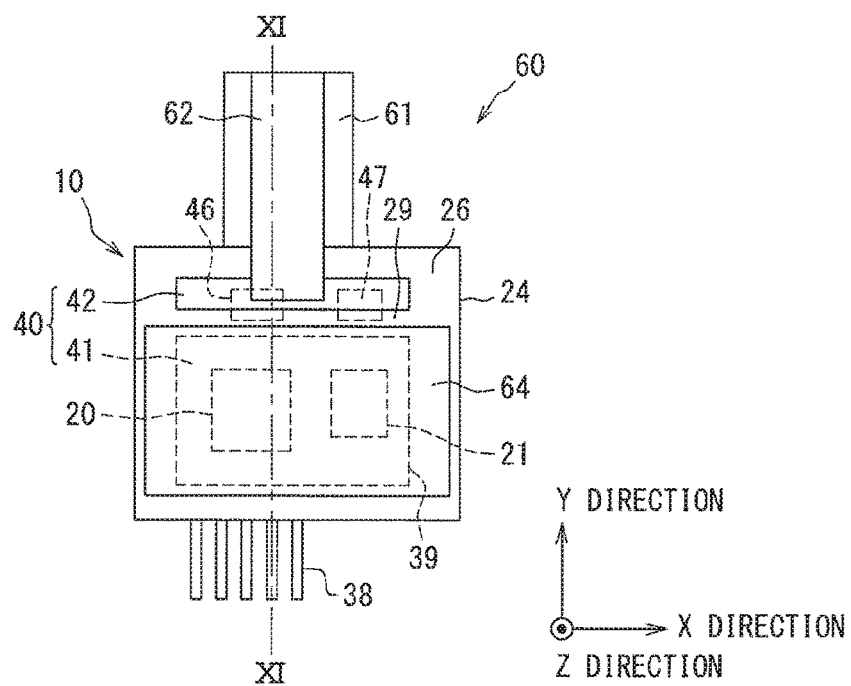
FIG. 10 is a plan view showing a schematic configuration of a power module including a semiconductor device according to a fourth embodiment.
Figure 11:
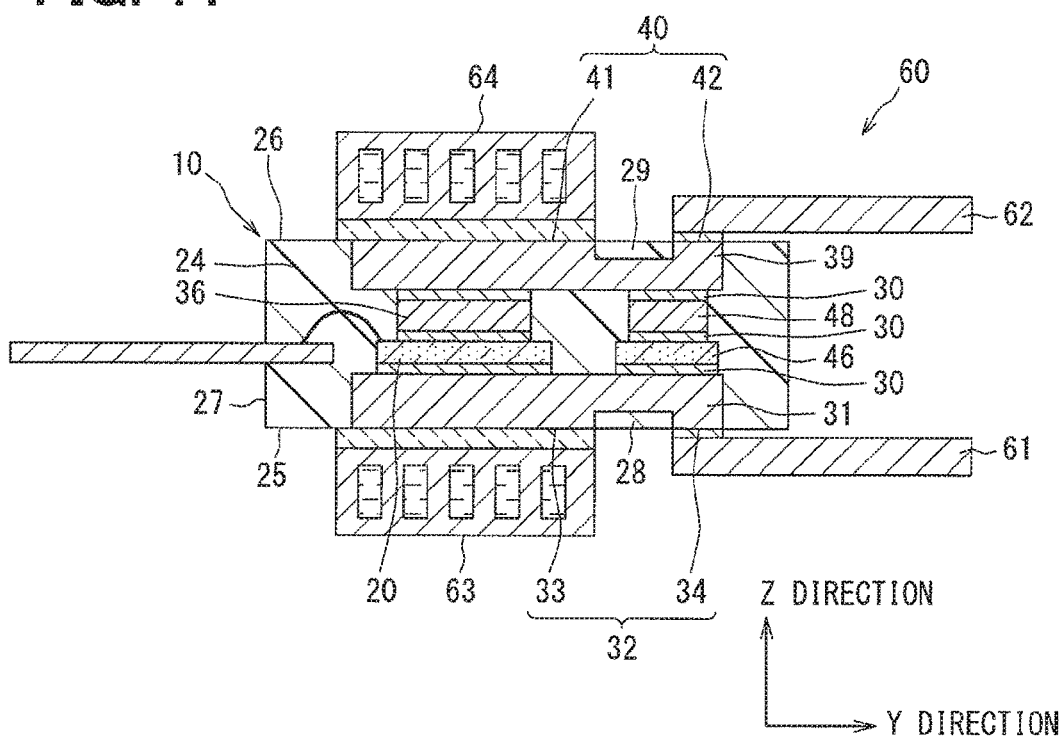
FIG. 11 is a sectional view taken along line XI-XI in FIG. 10.

The semiconductor device 10 shown in FIGS. 10 and 11 includes dummy chips 46, 47, and a dummy terminal 48 as elements constituting the spacer.

The dummy chip 46 is obtained by forming a dummy element for electrically separating the first heatsink 31 and the second heatsink 39, on a semiconductor substrate such as silicon. A thickness of the dummy chip 46 is almost the same as a thickness of a semiconductor chip 20. Further, the dummy chip 46 is arranged side by side with the semiconductor chip 20 in the Y-direction, and is arranged to overlap the electrical connection regions 34, 42 as seen in projection view from the Z-direction.

The dummy chip 47 is obtained also by forming a dummy element for electrically separating the first heatsink 31 and the second heatsink 39, on a semiconductor substrate. A thickness of the dummy chip 47 is almost the same as a thickness of a semiconductor chip 21. Further, the dummy chip 47 is arranged side by side with the semiconductor chip 21 in the Y-direction, and is arranged to overlap the electrical connection regions 34, 42 as seen in projection view from the Z-direction. That is, the dummy chips 46, 47 are arranged side by side in the X-direction.

An electrode (not shown) is formed on a first main surface 22 of the dummy chip 46. This electrode and the first heatsink 31 are connected with each other via solder 30. An electrode (not shown) is also formed on a second main surface of the dummy chip 46. This electrode and the dummy terminal 48 are connected with each other via the solder 30. The dummy terminal 48 is connected to the second heatsink 39 via the solder 30. Accordingly, the dummy chip 46 and the dummy terminal 48 are interposed between the first heatsink 31 and the second heatsink 39.

Likewise, an electrode (not shown) is formed on a side of a first main surface 22 of the dummy chip 47. This electrode and the first heatsink 31 are connected with each other via the solder 30. An electrode (not shown) is also formed on a side of a second main surface of the dummy chip 47. This electrode and the dummy terminal 48 are connected with each other via the solder 30. The dummy terminal 48 is connected to the second heatsink 39 via the solder 30. Accordingly, the dummy chip 47 and the dummy terminal 48 are interposed between the first heatsink 31 and the second heatsink 39.

Interposing the spacer including the dummy chips 46, 47 and the dummy terminal 48 between the heatsinks 31, 39 in this manner can suppress generation of inclination of at least one of the heatsinks 31 and 39 at the time of reflowing the solder 30 in the manufacturing process of the semiconductor device 10.

Further, the dummy chips 46, 47 and the dummy terminal 48 lead to an increase in number of contact points between the heatsinks 31, 39. Accordingly, the heatsinks 31, 39 are inclined by the pressure of the resin at the time of molding a sealing resin body 24, and it is thereby possible to suppress the stress acting on the semiconductor chips 20, 21.

Further, it is also possible to reduce the stress acting on the semiconductor chips 20, 21 at the time of connecting the bus bars 61, 62.

Although the example has been shown in the present embodiment where the two dummy chips 46, 47 are provided, the number of dummy chips is not particularly restricted. For example, the semiconductor device 10 may include one dummy chip, or may include three or more dummy chips.

Further, the spacer is not restricted to the dummy chips 46, 47 and the dummy terminal 48. The spacer may be interposed between the first heatsink 31 and the second heatsink 39 in correspondence with the electrical connection regions 34, 42, to electrically separate the first heatsink 31 and the second heatsink 39 from each other while being connected to the respective heatsinks 31, 39.

The configuration shown in the present embodiment is also applicable to the configurations shown in the second embodiment and the third embodiment.

Fifth Embodiment

In the present embodiment, descriptions of portions in common with those of the semiconductor device 10 and the power module 60 in the first embodiment are omitted.

The example has been shown in the first embodiment where the insulating separators 28, 29 formed by the sealing resin body 24 separate the exposed surfaces 32, 40 into the heat dissipation regions 33, 41 and the electrical connection regions 34, 42. By contrast, in the present embodiment, the insulating plates 65 separate the exposed surfaces 32, 40 into the heat dissipation regions 33, 41 and the electrical connection regions 34, 42.

Figure 12:
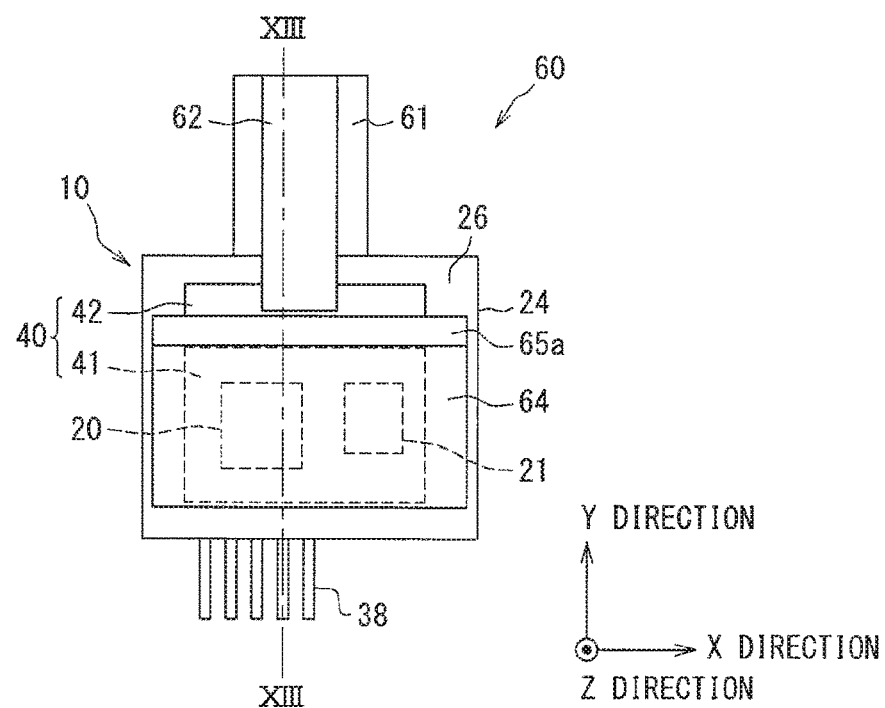
FIG. 12 is a plan view showing a schematic configuration of a power module including a semiconductor device according to a fifth embodiment.
Figure 13:
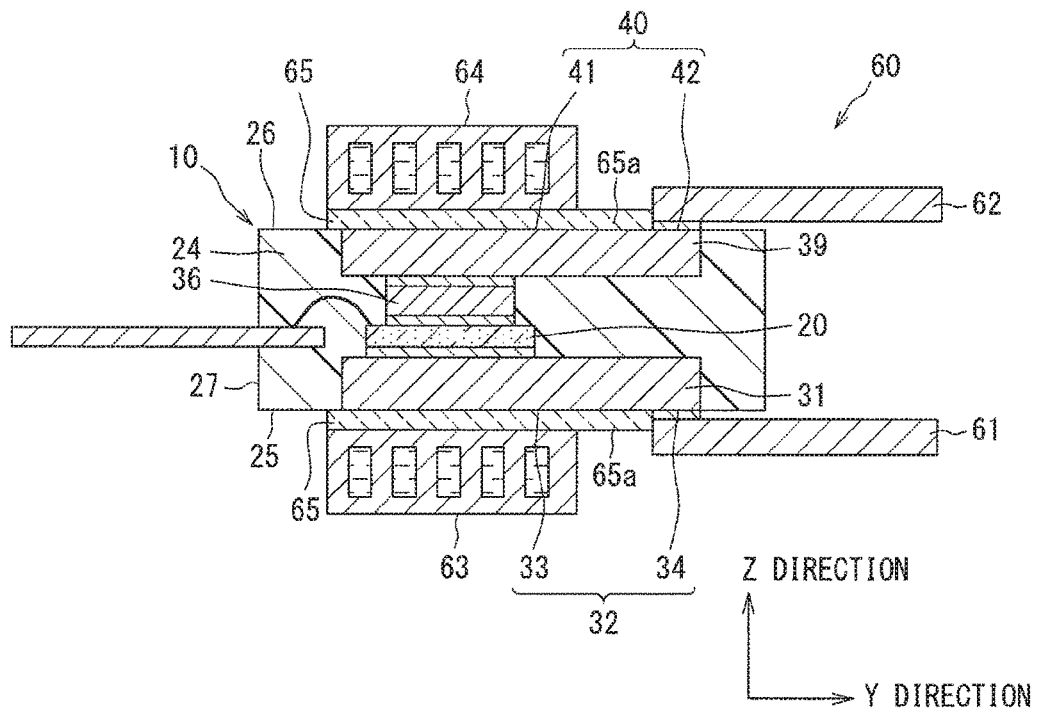
FIG. 13 is a sectional view taken along line XIII-XIII in FIG. 12.

As shown in FIGS. 12 and 13, the insulating plates 65 have extended parts 65a extending more outward than clearances between the heat dissipation regions 33, 41 and coolers 63, 64. The extended parts 65a are extended toward the electrical connection regions 34, 42 in a direction in which the heat dissipation regions 33, 41 and the electrical connection regions 34, 42 are arranged side by side (Y-direction). A portion of the exposed surface 32 which is exposed from the insulating plate 65 is the electrical connection region 34. Likewise, a portion of the exposed surface 40 which is exposed from the insulating plate 65 is the electrical connection region 42.

As thus described, the extended parts 65a are provided in the insulating plates 65, and it is thereby possible to separate the heat dissipation regions 33, 41 connected with the coolers 63, 64 from the electrical connection regions 34, 42 connected with bus bars 61, 62. Further, the insulating plate 65 is provided between the first bus bar 61 and the first cooler 63 on a side of a front surface 25 of a sealing resin body 24, and a creeping distance can thereby be gained. Moreover, the contact (short circuit) between the first bus bar 61 and the first cooler 63 can be prevented.

Likewise, the insulating plate 65 is provided between the second bus bar 62 and the second cooler 64 on a side of a rear surface 26 of the sealing resin body 24, and a creeping distance can thereby be gained. Moreover, the contact (short circuit) between the second bus bar 62 and the second cooler 64 can be prevented.

Note that the configuration shown in the present embodiment is also applicable to the configurations shown in the second embodiment, the third embodiment, and the fourth embodiment.

Although the preferred embodiments of the present disclosure have been described above, the present disclosure is not restricted to the above embodiments, and can be subjected to a variety of modifications and be performed in a range not deviating from the gist of the present disclosure.

The configuration of the semiconductor device 10 is not restricted to the 1-in-1 package structure having only one of the upper and lower arms, or to the 2-in-1 package structure having the arms for one phase. For example, the configuration of the semiconductor device 10 can also be applied to a 6-in-1 package having upper and lower arms for three phases.

Figure 14:
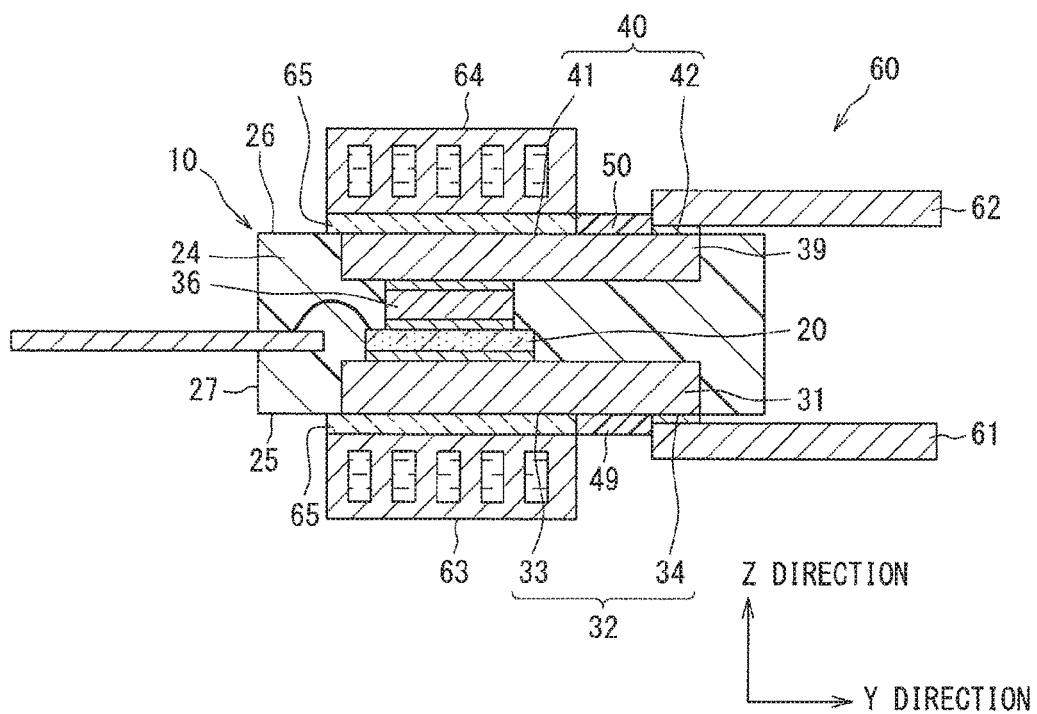
FIG. 14 is a sectional view showing a first modified example and corresponds to FIG. 3.

The example has been shown where the heat dissipation regions 33, 41 and the electrical connection regions 34, 42 are separated from each other by the insulating separators 28, 29 formed by disposing the sealing resin body 24 in the grooves 35, 43 of the heatsinks 31, 39. However, the separation by the sealing resin body 24 is not restricted to the above example. For example, as in a first modified example shown in FIG. 14, the heat dissipation regions 33, 41 and the electrical connection regions 34, 42 are separated from each other by insulating separators 49, 50 arranged on the exposed surfaces 32, 40 of the heatsinks 31, 39. The insulating separators 49, 50 are formed across the corresponding heatsinks 31, 39 along the X-direction. The insulating separators 49, 50 are part of the sealing resin body 24. Note that the exposed surfaces 32, 32a, 32b are also referred to as a first exposed surface, and the exposed surfaces 40, 40a, 40b are also referred to as a second exposed surface.

The insulating separators 49, 50 can be formed by cutting the sealing resin body 24 at the time of the cutting so as to leave the insulating separators 49, 50. When the sealing resin body 24 is not to be cut, a mold die having a cavity wall surface in a predetermined shape is used to enable formation of the insulating separators 49, 50 at the time of molding the sealing resin body 24. When the insulating separators 49, 50 projecting from the heatsinks 31, 39 are employed in this manner, the insulating separators 49, 50 serve as stoppers of displacement, making it easy to position the bus bars 61, 62, the coolers 63, 64, and the insulating plates 65. Further, the contact between the bus bars 61, 62 and the corresponding coolers 63, 64 can be more effectively suppressed.

Figure 15:
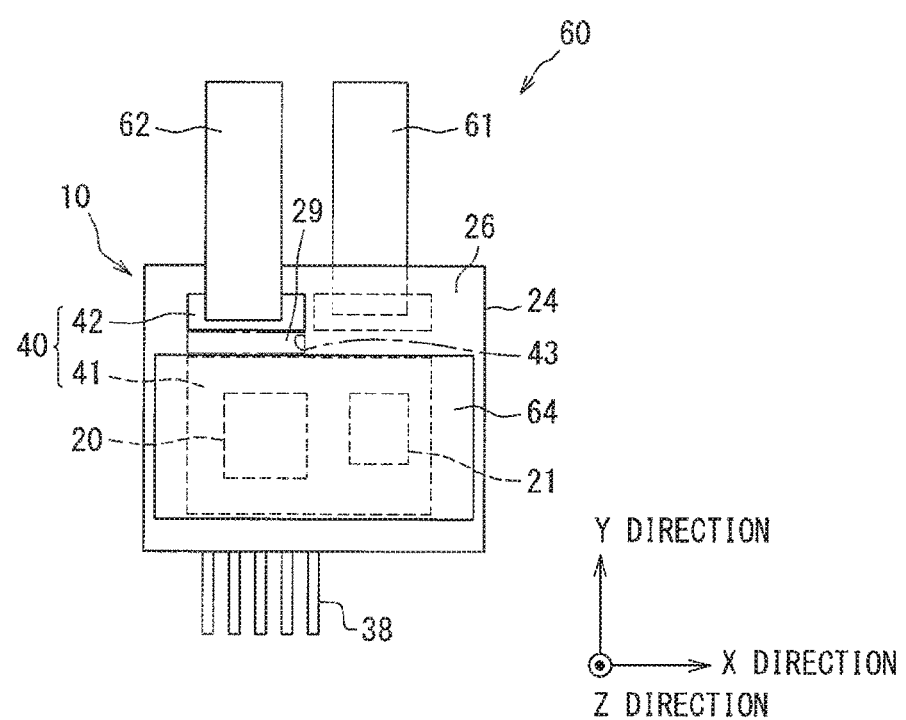
FIG. 15 is a plan view showing a second modified example and corresponds to FIG. 2.

The example has been shown where the electrical connection region 34 of the first heatsink 31 and the electrical connection region 42 of the second heatsink 39 are provided to overlap each other as seen in projection view from the Z-direction. However, there may be employed a configuration, as in a second modified example shown in FIG. 15, where the electrical connection regions 34, 42 are arranged apart from each other as seen in projection view from the Z-direction. In this case, the effect of mutually cancelling magnetic fluxes cannot be exerted, but different advantageous effects can be exerted.

As above, according to the present disclosure, semiconductor devices and power modules in a variety of forms can be provided.

A semiconductor device according to one aspect of the present disclosure is a semiconductor device of a double-side cooling structure having a bus bar electrically connected thereto as an electrical relay member and coolers independently arranged on both sides thereof for cooling. The semiconductor device includes: a semiconductor chip including an element and having a first main surface on which a first main electrode of the element is arranged and a second main surface on which a second main electrode of the element is arranged, the second main surface being opposite to the first main surface: a sealing resin body having a front surface facing the first main surface of the semiconductor chip in a thickness direction of the semiconductor chip, a rear surface facing the second main surface of the semiconductor chip in the thickness direction, and a side surface connecting between the front surface and the rear surface, the sealing resin body being configured to seal the semiconductor chip; a first heatsink arranged on the first main surface of the semiconductor chip and electrically connected to the first main electrode; and a second heatsink arranged on the second main surface of the semiconductor chip and electrically connected to the second main electrode. The first heatsink is exposed from the front surface of the sealing resin body, of the front surface, the rear surface, and the side surface of the sealing resin body, to have an exposed surface opposite to a surface facing the semiconductor chip. The second heatsink is exposed from the rear surface of the sealing resin body, of the front surface, the rear surface, and the side surface of the sealing resin body, to have an exposed surface opposite to a surface facing the semiconductor chip, the exposed surface being exposed from the rear surface. An exposed surface of a heatsink to be electrically connected to the bus bar, of the first heatsink and the second heatsink, corresponds to a region overlapping the semiconductor chip as seen in projection view from the thickness direction, and has a heat dissipation region to be thermally connected with the coolers and an electrical connection region to be electrically connected with the bus bar, the electrical connection region being a peripheral region of the heat dissipation region.

With this configuration, the coolers are independently thermally connected to the heat dissipation regions on the exposed surfaces of the respective heatsinks. It is thus possible to dissipate the heat from the semiconductor chip to both the sides of the semiconductor device.

Further, the bus bar is electrically connected to the electrical connection region on the exposed surface of each heatsink. As thus described, the bus bar is connected to the heatsink without an external connection terminal (outer lead). Since no external connection terminal is provided, it is possible to suppress an increase in inductance caused by a thin terminal.

Further, in the semiconductor device according to one aspect of the present disclosure, the electrical connection region of the first heatsink and the electrical connection region of the second heatsink may be in the positional relation of overlapping each other as seen in projection view from the thickness direction.

With this configuration, the bus bar connected to the electrical connection region of the first heatsink and the bus bar connected to the electrical connection region of the second heatsink are in the positional relation of overlapping each other as seen in projection view from the thickness direction. In the bus bar connected to the first heatsink (first main electrode) and the bus bar connected to the second heatsink (second main electrode), directions in which a current flows are reversed to each other, thereby enabling enhancement of the effect of mutually cancelling magnetic fluxes. Hence it is possible to reduce parasitic inductance.

Further, in the semiconductor device according to one aspect of the present disclosure, the heat dissipation region and the electrical connection region may be separated from each other by the sealing resin body.

With this configuration, the creeping distance between the cooler and the bus bar can be gained by the sealing resin body located between the heat dissipation region and the electrical connection region. Further, the contact between the cooler and the bus bar can be inhibited.

A power module according to another aspect of the present disclosure is a power module including: the semiconductor device; coolers independently arranged on the heat dissipation regions of the exposed surfaces of the respective heatsinks and configured to cool the semiconductor device; a first bus bar connected to the electrical connection region of the exposed surface of the first heatsink; a second bus bar connected to the electrical connection region of the exposed surface of the second heatsink; and insulating plates independently interposed between the heat dissipation regions of the exposed surfaces of the respective heatsinks and the coolers, and configured to transmit heat of the semiconductor device to the coolers and to electrically separate the semiconductor device and the coolers from each other. The insulating plates have extended parts extending more outward than clearances between the heat dissipation regions and the coolers to separate the heat dissipation regions and the electrical connection regions from each other.

With this configuration, the creeping distance between the cooler and the bus bar can be gained by the extended part of the insulating plate. Further, the contact between the cooler and the bus bar can be inhibited.

While various embodiments, configurations, and aspects of semiconductor device and power module have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

The invention claimed is:

1. A semiconductor device of a double-side cooling structure having a bus bar electrically connected as an electrical relay member, and coolers independently arranged on both sides of the semiconductor device for cooling, the semiconductor device comprising:
a semiconductor chip that includes an element, and has a first main surface on which a first main electrode of the element is arranged and a second main surface on which a second main electrode of the element is arranged, the second main surface being opposite to the first main surface;
a sealing resin body that has a first surface facing the first main surface of the semiconductor chip and a second surface facing the second main surface of the semiconductor chip in a thickness direction of the semiconductor chip and also has a side surface connecting between the first surface and the second surface, the sealing resin body being configured to seal the semiconductor chip;
a first heatsink that is arranged facing the first main surface of the semiconductor chip and electrically connected to the first main electrode; and
a second heatsink that is arranged facing the second main surface of the semiconductor chip and electrically connected to the second main electrode,
wherein:
the first heatsink is exposed only to the first surface of the sealing resin body, of the first surface, the second surface, and the side surface of the sealing resin body, to have a first exposed surface opposite to a surface facing the semiconductor chip;
the second heatsink is exposed only to the second surface of the sealing resin body, of the first surface, the second surface, and the side surface of the sealing resin body, to have a second exposed surface opposite to a surface facing the semiconductor chip, the second exposed surface being exposed from the second surface;
one or both of the first exposed surface and the second exposed surface is electrically connected to the bus bar;
one or both of the first exposed surface and the second exposed surface includes a heat dissipation region and an electrical connection region;
the heat dissipation region overlaps with the semiconductor chip as seen in projection view from the thickness direction and is thermally connected with the coolers; and
the electrical connection region is a peripheral region around the heat dissipation region and is electrically connected with the bus bar.

2. The semiconductor device according to claim 1, wherein:
both the first exposed surface and the second exposed surface are electrically connected to the bus bar, and
the semiconductor device further comprises a spacer that is interposed between the first heatsink and the second heatsink in correspondence with the electrical connection regions, the spacer being configured to electrically separate the first heatsink and the second heatsink while being connected to each of the heatsinks.

3. A power module comprising:
the semiconductor device according to claim 1;
coolers that are independently arranged on the heat dissipation region of the first exposed surface and the second exposed surface, and configured to cool the semiconductor device;
a first bus bar that is connected to the electrical connection region of the first exposed surface;
a second bus bar that is connected to the electrical connection region of the second exposed surface; and
insulating plates that are independently interposed between the heat dissipation region of the first exposed surface and the second exposed surface and each of the coolers, and configured to transmit heat of the semiconductor device to the coolers and to electrically separate the semiconductor device and the coolers from each other,
wherein:
the insulating plates have extended parts extending more outward than clearances between the heat dissipation regions and the coolers to separate the heat dissipation regions and the electrical connection regions from each other.

4. The semiconductor device according to claim 1, wherein:
the heat dissipation region and the electrical connection region are arranged flush with each other.

5. The semiconductor device according to claim 1, wherein:
the heat dissipation region and the electrical connection region are arranged on an identical height in the thickness direction of the first heastsink and the second heatsink.

6. The semiconductor device according to claim 1, wherein:
the heat dissipation region and the electrical connection region are separated from each other by the sealing resin body.

7. The semiconductor device according to claim 6, wherein:
at least one of the first heatsink and the second heatsink has a groove provided between the heat dissipation region and the electrical connection region; and
the sealing resin body is arranged in the groove to separate the heat dissipation region and the electrical connection region from each other.

8. The semiconductor device according to claim 1, wherein:
both the first exposed surface and the second exposed surface are electrically connected to the bus bar, and
the electrical connection region of the first heatsink and the electrical connection region of the second heatsink are in a positional relation of overlapping each other as seen in projection view from the thickness direction.

9. A power module comprising:
the semiconductor device according to claim 8;
coolers that are independently arranged on the heat dissipation region of the first exposed surface and the second exposed surface and configured to cool the semiconductor device;
a first bus bar that is connected to the electrical connection region of the first exposed surface; and
a second bus bar that is connected to the electrical connection region of the second exposed surface,
wherein:
the first bus bar and the second bus bar extend more outward than the semiconductor device in a single direction orthogonal to the thickness direction, and are in a positional relation of overlapping each other as seen in projection view from the thickness direction.

10. The power module according to claim 9, wherein:

at least one of the first bus bar and the second bus bar has a bent part provided more outward than the semiconductor device; and a clearance between the first bus bar and the second bus bar facing each other is narrower than a position overlapping with the semiconductor device, on an outside of the semiconductor device.

* * * * *